United States Patent
Choi et al.

(10) Patent No.: US 9,638,477 B1
(45) Date of Patent: May 2, 2017

(54) SEALLESS COOLING DEVICE HAVING MANIFOLD AND TURBULATOR

(71) Applicant: Caterpillar Inc., Peoria, IL (US)

(72) Inventors: Edward Choi, Edwards, IL (US);
Chris J. Scolton, Edelstein, IL (US);
John Walter Winkler, Peoria, IL (US)

(73) Assignee: Caterpillar, Inc., Peoria, IL (US)

( * ) Notice: Subject to any disclaimer, the term of this patent is extended or adjusted under 35 U.S.C. 154(b) by 27 days.

(21) Appl. No.: 14/881,588

(22) Filed: Oct. 13, 2015

(51) Int. Cl.
*H05K 7/20* (2006.01)
*F28F 3/12* (2006.01)
*F28F 13/12* (2006.01)
*B23P 15/26* (2006.01)
*H01L 23/473* (2006.01)

(52) U.S. Cl.
CPC ............... *F28F 3/12* (2013.01); *B23P 15/26* (2013.01); *F28F 13/12* (2013.01); *H05K 7/20009* (2013.01); *H05K 7/20218* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467
USPC ...... 361/676–678, 679.46–679.54, 688–723, 361/699–704, 709–710, 719–721; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | | |
|---|---|---|---|
| 6,112,804 A | 9/2000 | Sachs et al. | |
| 6,391,251 B1 | 5/2002 | Keicher et al. | |
| 8,650,886 B2 | 2/2014 | Wilcoxon et al. | |
| 2012/0114527 A1* | 5/2012 | Hoglund | B01F 5/0604 422/82.05 |
| 2012/0133467 A1* | 5/2012 | Salomaki | H01F 27/10 336/60 |
| 2012/0144833 A1* | 6/2012 | Nilsson | F23D 11/443 60/738 |
| 2012/0152517 A1* | 6/2012 | Bruce | B01D 17/0214 166/57 |
| 2012/0160466 A1* | 6/2012 | Pollard | F02C 7/14 165/185 |
| 2012/0163994 A1* | 6/2012 | Kwon | F01D 5/186 416/97 R |
| 2012/0171027 A1* | 7/2012 | Albers | F01D 11/005 415/208.1 |
| 2012/0174588 A1* | 7/2012 | Rackwitz | F23R 3/343 60/740 |
| 2012/0177503 A1* | 7/2012 | Lee | F01D 5/187 416/96 R |

(Continued)

*Primary Examiner* — Anthony Haughton
*Assistant Examiner* — Razmeen Gafur
(74) *Attorney, Agent, or Firm* — Finnegan, Henderson, Farabow, Garrett & Dunner, LLP (57) ABSTRACT

A cooling device configured to be connected to an object having a surface is disclosed. The cooling device may include a manifold configured to be deposited directly onto the surface of the object, wherein the manifold includes a first side configured to be deposited directly onto the surface of the object, a cavity formed in the first side, an inlet channel fluidly connected to the cavity, and an outlet channel fluidly connected to the cavity. The cooling device may further include a turbulator configured to be deposited directly onto the surface of the object, wherein the turbulator extends into the cavity of the manifold.

23 Claims, 5 Drawing Sheets

(56) References Cited

U.S. PATENT DOCUMENTS

| | | | | |
|---|---|---|---|---|
| 2012/0193077 A1* | 8/2012 | Choi | ............... | F28F 13/12 |
| | | | | 165/109.1 |
| 2012/0216503 A1* | 8/2012 | Snyder | ............... | F02C 3/02 |
| | | | | 60/39.38 |
| 2012/0216796 A1* | 8/2012 | Benedetti | ............... | F24C 3/006 |
| | | | | 126/547 |
| 2012/0227939 A1* | 9/2012 | Aplienz | ............... | F28D 1/0391 |
| | | | | 165/109.1 |
| 2012/0230838 A1* | 9/2012 | Hada | ............... | F01D 5/187 |
| | | | | 416/97 R |
| 2012/0247740 A1* | 10/2012 | Gertner | ............... | F28D 9/0006 |
| | | | | 165/148 |
| 2012/0269704 A1* | 10/2012 | Hoglund | ............... | F28F 3/083 |
| | | | | 422/560 |
| 2012/0272654 A1* | 11/2012 | Kaleeswaran | ............... | F23R 3/002 |
| | | | | 60/772 |
| 2012/0274029 A1* | 11/2012 | Khonsari | ............... | F16J 15/3404 |
| | | | | 277/405 |
| 2012/0276361 A1* | 11/2012 | James | ............... | B28B 1/002 |
| | | | | 428/223 |
| 2012/0282109 A1* | 11/2012 | Stiehler | ............... | F01D 5/081 |
| | | | | 416/97 R |
| 2012/0285670 A1* | 11/2012 | Hoglund | ............... | B01J 19/249 |
| | | | | 165/166 |
| 2012/0286597 A1* | 11/2012 | Gundtoft | ............... | H02K 3/24 |
| | | | | 310/59 |
| 2012/0304654 A1* | 12/2012 | Melton | ............... | F23R 3/002 |
| | | | | 60/746 |
| 2012/0305216 A1* | 12/2012 | Arnot | ............... | F02M 31/16 |
| | | | | 165/56 |
| 2012/0324990 A1* | 12/2012 | Briese | ............... | G01F 1/684 |
| | | | | 73/114.35 |

* cited by examiner

SEALLESS COOLING DEVICE HAVING MANIFOLD AND TURBULATOR

TECHNICAL FIELD

The present disclosure relates generally to a cooling device and, more particularly, to a sealless cooling device having a manifold and a turbulator.

BACKGROUND

Devices that generate significant amounts of heat and/or operate under high-heat conditions, such as motors, electronic components, engines, exhaust systems, gearboxes, etc., often include cooling devices to reduce their operating temperature. Many cooling devices are configured to transfer thermal energy from a warmer object to a cooler object through conduction, convection, surface convection, or combinations thereof. Cooling devices often incorporate highly conductive materials and special structures, such as fins, to promote greater heat transfer. Coolants, such as air, water, refrigerants, and other fluids are also commonly used to improve the performance of cooling devices. Cooling devices that bring a coolant in direct contact with the device to be cooled are known as direct cooling devices.

Liquid cooling mediums, such as water, are often utilized in direct cooling devices due to their high capacity for heat transfer. Many cooling devices that utilize liquid coolants include a closed fluid circuit that allows reuse of the coolant. Seals, gaskets, and other materials are typically used at circuit connections to prevent leakage and contamination of the coolant. Heat sink structures, such as metal foams, have also been used in conjunction with liquid coolants for increasing the thermal connection between the coolant and the warm object. However, seals and gaskets can degrade over time and allow the liquid coolant to escape from the fluid circuit. As a result, some manufacturers avoid the use of all liquid coolants in applications where contact between leaked coolant and certain components of the warm object can cause significant damage. Also, heat sink structures can involve complicated manufacturing techniques and be costly to implement.

One attempt to improve heat transfer in a cooling device is described in U.S. Pat. No. 6,391,251 ("the '251 patent") to Keicher et al. that issued on May 21, 2002. The '251 patent describes a method of forming an injection mold block having a mold cavity and cooling passages that are formed integrally with the injection mold block via a direct material deposition process. The cooling passages are located internally to the mold block at a uniform depth from a surface of the mold block to limit the cooing rate of material in the mold cavity. Adjacent cooling passages within the mold block form internal finned structures that increase the surface area of contact between the mold block and coolants within the passages.

Although the method of the '251 patent may be somewhat effective at forming internal cooling passages within a mold block, it may not be applicable for other types of cooling devices. In particular, the method of the '251 patent may not accommodate direct cooling of external objects or materials.

The cooling device of the present disclosure solves one or more of the problems set forth above and/or other problems of the prior art.

SUMMARY

In one aspect, the present disclosure is directed to a cooling device configured to be connected to an object having a surface. The cooling device may include a manifold configured to be deposited directly onto the surface of the object, wherein the manifold includes a first side configured to be deposited directly onto the surface of the object, a cavity formed in the first side, an inlet channel fluidly connected to the cavity, and an outlet channel fluidly connected to the cavity. The cooling device may further include a turbulator configured to be deposited directly onto the surface of the object, wherein the turbulator extends into the cavity of the manifold.

In another aspect, the present disclosure is directed to a method of forming a cooling device on an object. The method may include directly depositing a manifold onto a surface of the object. Directly depositing the manifold may include directly depositing a first side of the manifold onto the surface of the object, forming a cavity in the first side, forming an inlet channel fluidly connected to the cavity, and forming an outlet channel fluidly connected to the cavity. The method may further include directly depositing a turbulator onto the surface of the object, wherein the turbulator extends into the cavity of the manifold.

In yet another aspect, the present disclosure is directed to an electronic device. The electronic device may include a surface and a cooling device connected to the surface. The cooling device may include a manifold deposited directly onto the surface of the electronic device. The manifold may include a first side deposited directly onto the surface of the electronic device, a cavity formed in the first side, an inlet channel fluidly connected to the cavity and an outlet channel fluidly connected to the cavity, and a turbulator deposited directly onto the surface of the electronic device. The turbulator may extend into the cavity of the manifold and include one or more of a lattice structure and a cell matrix, The manifold and the turbulator may each respectively be formed of one or more of a metal, a plastic, a ceramic, and a mineral.

DETAILED DESCRIPTION

Figure 1:
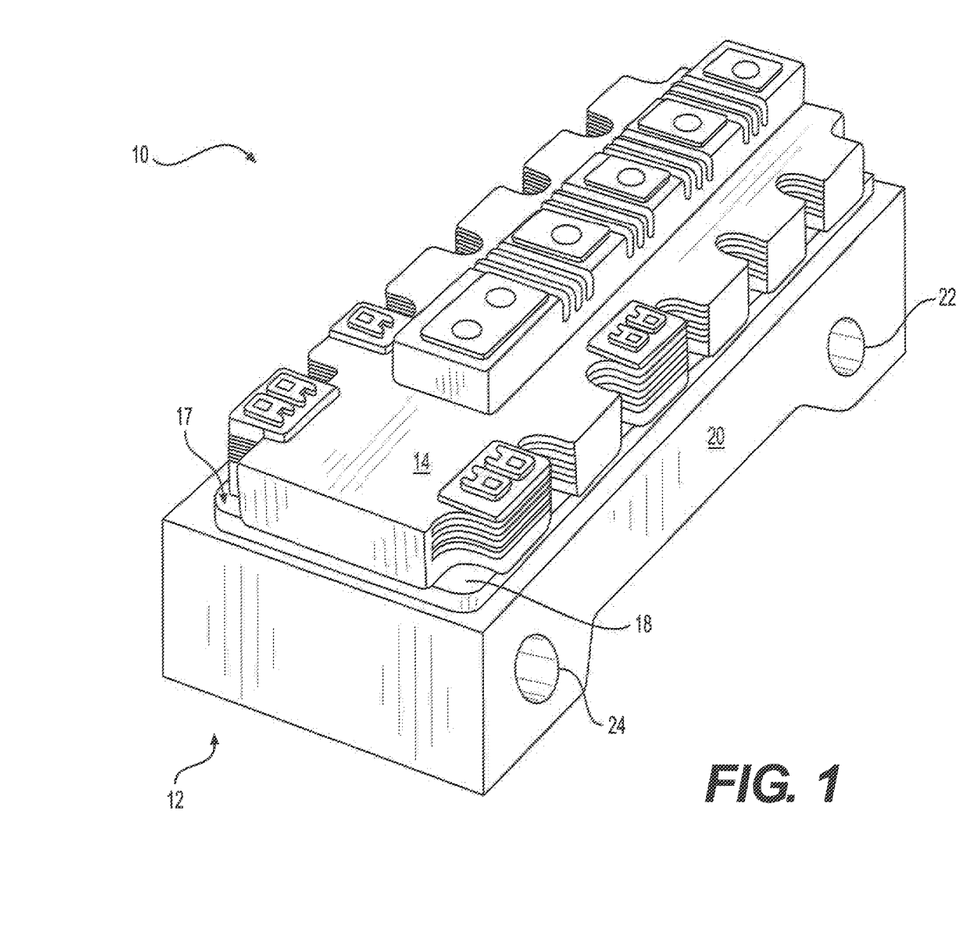
FIG. 1 is an isometric view illustration of an electronic device with an exemplary disclosed sealless cooling device.

FIG. 1 illustrates an exemplary electronic device 10 connected to an exemplary disclosed sealless cooling device (cooling device) 12. Although FIG. 1 shows cooling device 12 connected to electronic device 10, it is understood that cooling device 12 may be used in conjunction with other devices that generate heat or operate at high-temperature operating conditions, such as, for example, motors, transformers, engines, exhaust systems, power plants, computer components (e.g., processors, power supplies, etc.), furnaces, heat exchangers, etc.

Electronic device 10 may embody, for example an insulated gate bipolar transistor (IGBT) 14. IGBT 14 may include one or more electronic components 16 (e.g., gates, resistors, diodes, transistors, etc.) (shown only in FIG. 3) configured to cooperate to perform the functions of IGBT 14. For example, IGBT 14 may be used as a switching element within a power inverter for converting direct current to alternating current and alternating current to direct current. As current is conducted from one terminal of IGBT 14 to another, the temperature of IGBT 14 and/or its electronic components 16 may increase. But as the temperature of IGBT 14 and/or its electronic components 16 increases, the electrical resistance of electronic components 16 may also increase, which can cause IGBT 14 and/or its electronic components 16 to become even hotter as electrical current through IGBT 14 remains constant. In some situations, this can lead to thermal runaway in IGBT 14 and result in the ultimate failure of IGBT 14 when one or more of its electronic components 16 becomes overheated.

Electronic components 16 of IGBT 14 may be mounted to or adjacent a base plate 18. Base plate 18 may be a board, plate, box, or other component that provides structure and/or protection for IGBT 14. In the embodiment of FIG. 1, base plate 18 may be a mounting plate having a first surface 17 opposite a second surface 19 (second surface shown only in FIGS. 4-5) configured to support electronic components 16 of IGBT 14 together in a unit or package and/or to allow IGBT 14 to be mounted to another device. Base plate 18 may be formed of metal, silicon, plastic, ceramic, combinations thereof, and/or other materials. In other embodiments, base plate 18 may be part of a box that provides structure for and encapsulates electronic components 16. In some embodiments, base plate 18 may be a dedicated structure for IGBT 14, such as a plate or a box constructed for the purpose of supporting IGBT 14. In other embodiments, base plate 18 may embody one or more components of a device or machine (e.g., frame components, body components, compartments, etc.) that also function to support and/or house IGBT 14. In some embodiments, base plate 18 may be integral with (e.g., formed as a single or unitary structure with) or a discrete component associated with IGBT 14.

Cooling device 12 may be attached to IGBT 14 to reduce the operating temperature of IGBT 14 and/or its electronic components 16. Cooling device 12 may include a manifold 20 configured to receive a coolant through an inlet channel 22 and expel the coolant through an outlet channel 24. Although cooling device 12 is shown in the embodiment of FIG. 1 as having manifold 20, it is understood that cooling device 12 may include additional or other cooling structures, such as fins and/or other structures that may be exposed to the atmosphere. Manifold 20 may be configured to receive a fluid coolant, such as a liquid or gaseous coolant (e.g., air, a refrigerant, water, etc.), via inlet channel 22.

Figure 2:
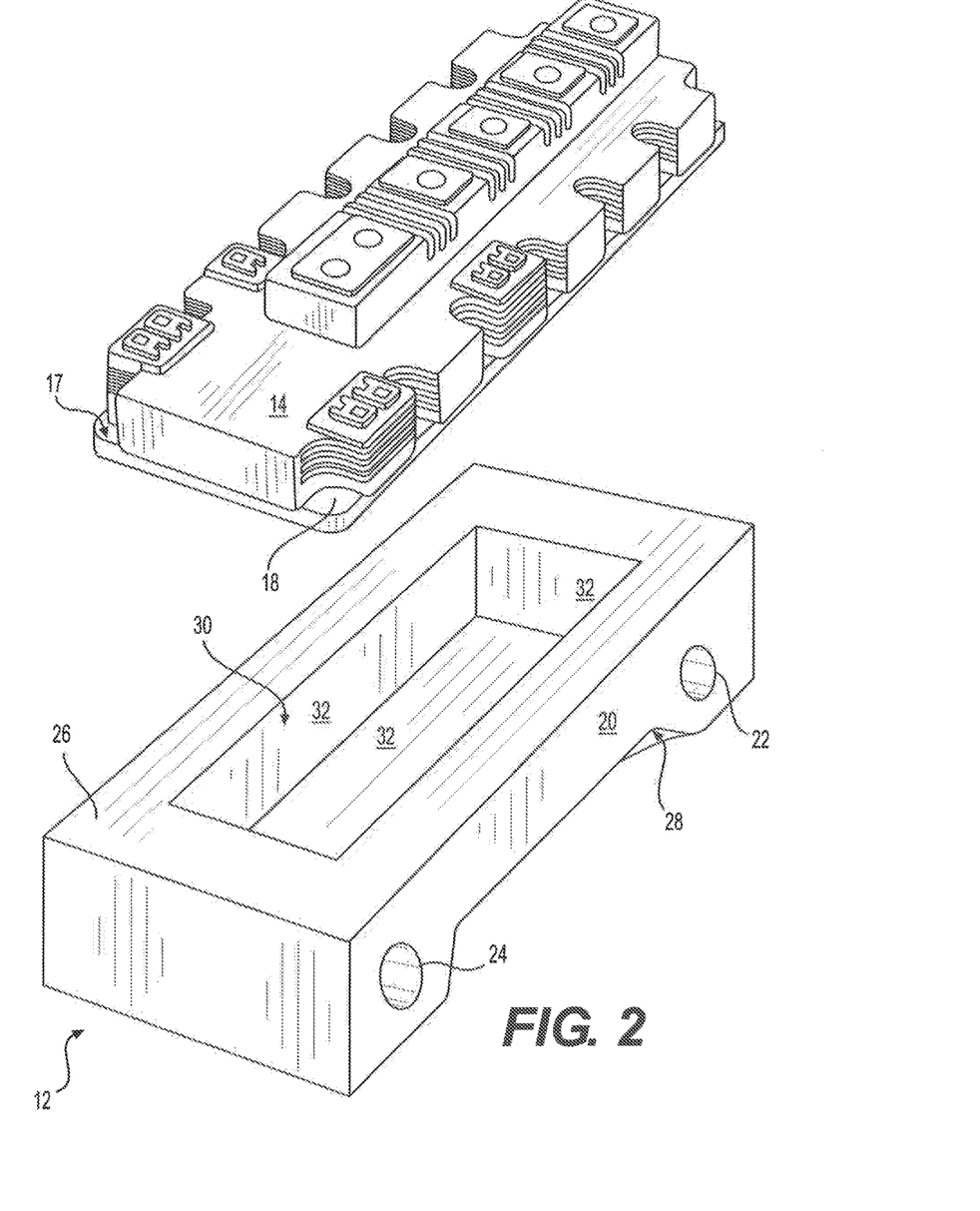
FIG. 2 is an exploded view illustration of the electronic device and sealless cooling device of FIG. 1.

As shown in FIG. 2, manifold 20 may have first side 26 opposite a second side 28. Manifold 20 may include an internal cavity 30 formed in first side 26. That is, internal cavity 30 may be disposed between first and second sides 26, 28 and may have an opening that is coplanar with first side 26. Inlet channel 22 and outlet channel 24 may each be fluidly connected to internal cavity 30. In this way, inlet and outlet channels 22, 24 may be configured to allow fluid flow into and out of internal cavity 30, respectively. Internal cavity 30 may include one or more internal surfaces 32 configured to contain fluid therein.

In some embodiments, cavity 30 may include one or more internal structures (not shown) configured to influence fluid flow through cavity 30. Internal structures may be configured to divide fluid flow among two or more sides of cavity 30, promote mixing of a fluid flow within cavity 30, guide fluid from inlet channel 22 to outlet channel 24, and/or improve a heat transfer between the fluid in cavity 30 and components of cooling device 12. Internal structures may include one or more walls, fins, ribs, slats, screens, meshes, membranes, diaphragms, filaments, or other types of structures.

Referring again to FIG. 1, cooling device 12 may be deposited directly onto electronic device 10. For example, manifold 20 may be deposited directly onto second surface 19 (referring to FIG. 4) of base plate 18. That is, manifold 20 may be fabricated on base plate 19, such as by a material deposition process (e.g., 3D printing). Manifold 20 may be formed of one or more of a metal, a plastic, a ceramic, a mineral, a combination thereof, and/or another type of material. As shown in FIG. 1, first side 26 of manifold 20 may be deposited directly onto second surface 19 of base plate 18, such that cavity 30 (referring to FIG. 2) may be between base plate 18 (i.e., second surface 19) and second side 28 of manifold 20. First side 26 of manifold 20 may be deposited directly onto second surface 19 of base plate 18 via an additive manufacturing process, such as 3D printing. In this way, cooling device 12 may be connected to electronic device 10 via a sealless junction. That is, the use of an additive manufacturing process to construct and deposit manifold 20 onto electronic device 10 may allow cavity 30 within manifold 20 to be sealed against electronic device 10 to form a leak-proof connection without the use of additional material, such as seals, gaskets, sealants (e.g., glue, caulk, tape, etc.).

By eliminating the use of other sealing materials between manifold 20 and electronic device 10 through the use of additive manufacturing techniques, future leakage and repair time necessitated by worn out or damaged sealing materials may be reduced or eliminated. Damage to electronic device 10 caused by leaked coolant through faulty sealing materials may also be reduced or eliminated. Additionally, manifolds having complex geometries that improve fluid flow and/or heat transfer may also be formed quickly and affordably via additive manufacturing techniques. Additional assembly and finishing steps (e.g., grinding, polishing, drilling, tapping, screwing, riveting, welding, brazing, bolting, etc.) may also be eliminated by depositing manifold 20 directly onto electronic device 10. As a result, cooling device 12 may be formed and assembled with electronic device 10 in a single fabrication process, thereby reducing the time, overhead (e.g., space and equipment), and cost of joining cooling device 12 and electronic device 10.

Figure 3:
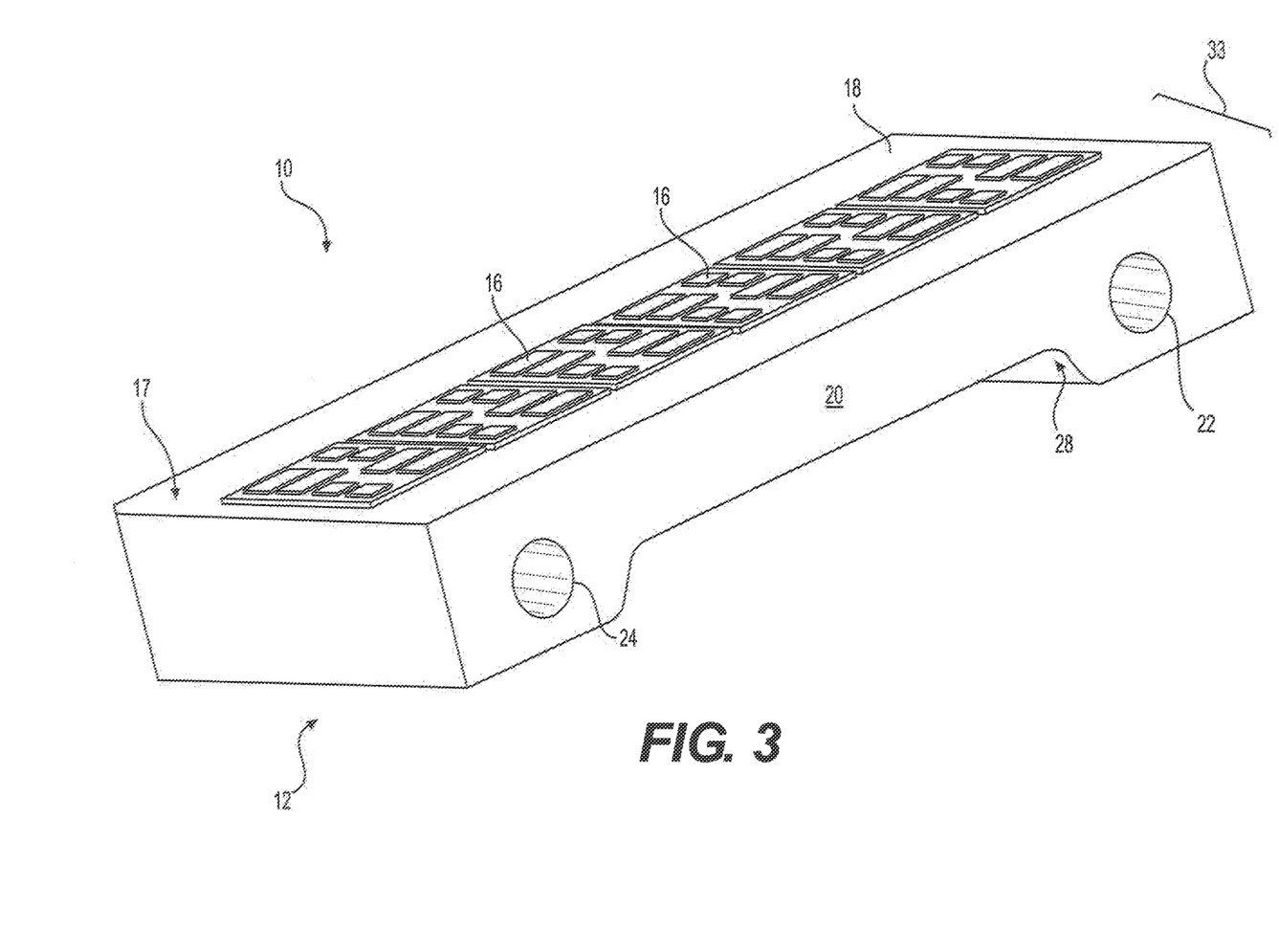
FIG. 3 is a an isometric view illustration of an exemplary disclosed sealless cooling device.

In some embodiments, cooling device 12 may be fabricated as a unitary structure that includes base plate 18 and/or other components. For example, as shown in FIG. 3, base plate 18 (referring to FIGS. 1 and 2) may be formed integrally with manifold 20 such that cooling device 12 may be configured to be connected to an object, such as, for example, an electronic device (e.g., IGBT 14, electronic components, etc.), after assembly. That is, manifold 20 may have a unitary body 33 that includes base plate 18 as an integral component. Unitary body 33 may include a first side that includes first surface 17 as an external surface and second surface 19 (shown only in FIGS. 4 and 5) as an internal surface opposite the external surface. First surface 17 may be configured to connect to other objects. For example, after cooling device 12 is fabricated, electronic components 16 of IGBT 14 may be connected to or otherwise disposed on first surface 17 after fabrication of cooling device 12.

Cavity 30 (shown only in FIG. 2) may be disposed within unitary body 33 such that cavity 30 may be positioned between second surface 19 and at least one other surface of unitary body 33, such as one or more of internal surface 32 (referring to FIG. 2). For example, unitary body 33 may be fabricated by a material deposition process, such as 3D printing, to allow the external features of unitary body 33 to be formed simultaneously with the internal features of unitary body 33, such as cavity 30 and/or other features. The internal features may include, for example, inlet channel 22, outlet channel 24, and/or other internal features for affecting fluid flow and/or heat transfer, such as a turbulator 34 (shown only in FIGS. 4 and 5). Accordingly, the fabrication and assembly of multiple separate components can be avoided. In this way, complex and detailed internal structures may be incorporated within unitary body 33 to achieve improved fluid flow and heat transfer while obviating the need for seals between components, thereby also eliminating fluid leakage from cooling device 12.

Figure 4:
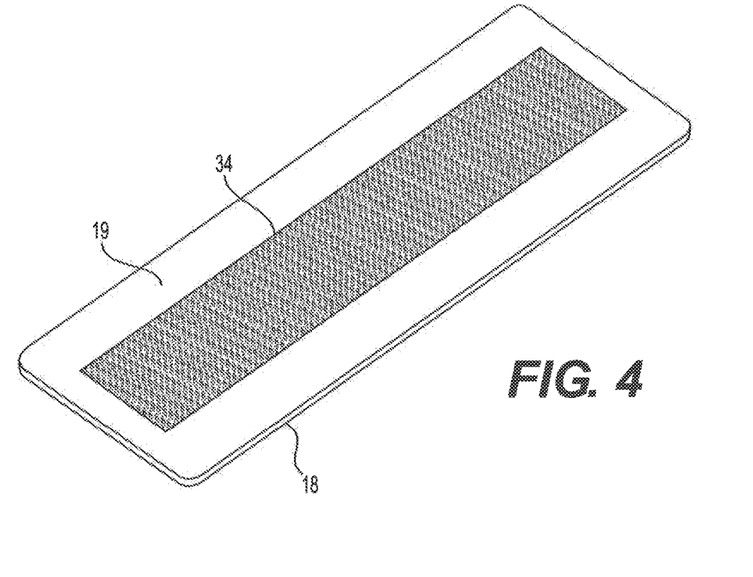
FIG. 4 is a bottom side view illustration of a base plate having an exemplary disclosed turbulator that may be used in conjunction with cooling devices of FIGS. 1-3.

Referring to FIG. 4, cooling device 12 may further include turbulator 34. Turbulator 34 may be deposited directly onto second surface 19 of base plate 18 and extend into cavity 30 (referring to FIG. 2). When manifold 20 is deposited onto base plate 18 (e.g., when base plate 18 is a component of electronic device 10 or another object), turbulator 34 may be deposited in conjunction with or simultaneously with manifold 20 onto second surface 19. When base plate 18 is formed as an integral component of unitary cooling device 12 (e.g., as in the example of FIG. 3), turbulator 34 may be deposited directly onto second surface 19 of base plate 18 during the fabrication of manifold 20.

Turbulator 34 may be formed of one or more of a metal, a plastic, a ceramic, a mineral, a combination thereof, and/or another type of material. Turbulator 34 may be formed of the same or a different material than manifold 20. That is, manifold 20 may be formed of a first material, and turbulator 34 may be formed of the first material or a second material. In some embodiments, the second material may have a different (e.g., higher or lower) thermal conductivity than the first material (e.g., turbulator 34 may have a higher thermal conductivity than manifold 20) to promote greater heat transfer from IGBT 14 to the coolant within manifold 20.

Turbulator 34 may be deposited directly onto second surface 19 via an additive manufacturing process, such as 3D printing. In this way, turbulator 34 may be directly connected (e.g., directly bonded, directly fused, directly joined, etc.) to second surface 19. Having a direct connection to second surface 19, as opposed to being adhered (e.g., glued, epoxied, etc.) or mechanically joined (e.g., via bolts, screws, interference fit, etc.), may allow for greater heat transfer from IGBT 14 to the coolant in manifold 20 via turbulator 34. That is, directly depositing turbulator 34 onto second surface 19 may create fusion at a granular and/or molecular level between turbulator 34 and second surface, thereby promoting greater conductive heat transfer at the junction of second surface 19 and turbulator. In this way, directly depositing turbulator 34 may allow for a greater and more efficient reduction of the operating temperature of electronic device 10 during operation.

Figure 5:
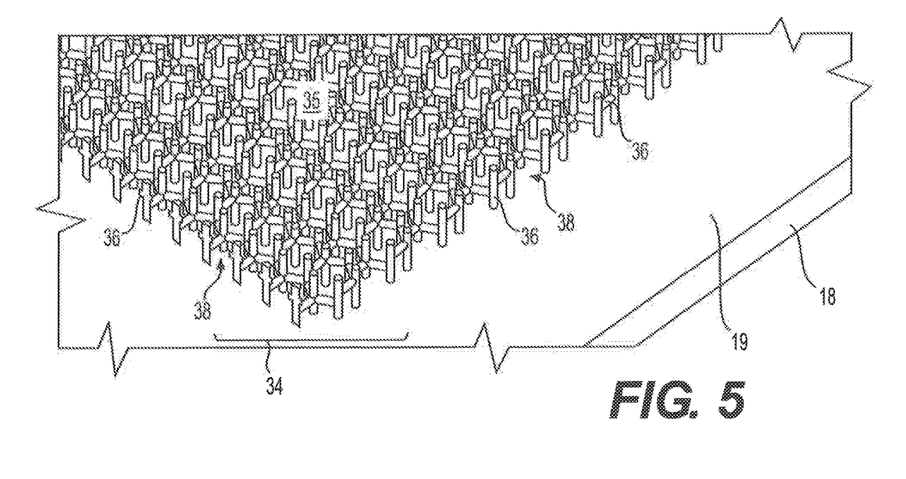
FIG. 5 is an enlarged view of the turbulator of FIG. 4.

As shown in FIG. 5, turbulator 34 may extend outward from second surface 19 (i.e., in a direction opposite from first surface 17—referring to FIG. 1—with respect to second surface 19). When cooling device 12 is assembled, turbulator 34 may extend into cavity 30 of manifold 20 to engage coolant therein. Turbulator 34 may include a plurality of filaments 36 ordered in a desired pattern or design that extend a desired distance from second side 19. Filaments 36 may each be deposited directly onto second surface 19 or onto another filament 36. Although filaments 36 are shown in FIG. 5 as having a circular cross section, it is understood that filaments 36 may have a different shaped cross section, such as a square, rectangular, elliptical, triangular, star, helical, hexagonal, or other shape of cross section. Because turbulator 34 may be deposited directly onto second surface 19, complex and detailed filament cross section shapes that may not be feasible through other fabrication methods may be chosen for simultaneous optimization of heat transfer and fluid flow Turbulator 34 may be formed of filaments 36 deposited according to an ordered arrangement or structure. For example, turbulator 34 may include a lattice structure. That is, filaments 36 may be deposited to form a lattice structure on second surface 19. Lattice structures may include a regular arrangement of filaments 36 (i.e., non-random arrangements) that are interlaced according to a pattern. Filaments 36 may also or alternatively be deposited in irregular arrangements, if desired. The arrangement of filaments 36 may include spaces 38 between filaments 36. Spaces 38 may be configured to channel fluid (e.g., coolant) through manifold 20. In this way, filaments 36 may provide a greater surface area over which coolant may contact turbulator 34 and draw heat energy from electronic device 10. Because turbulator 34 may be deposited directly onto second surface 19, complex and detailed lattice shapes that may not be feasible through other fabrication methods may be chosen for simultaneous optimization of heat transfer and fluid flow.

Turbulator 34 may also or alternatively include a cell matrix 35. That is, filaments 36 may be deposited to form cell matrix 35 on second surface 19. Cell matrix 35 may include a number of filament cells arranged in rows and/or columns on second surface 19 to form turbulator 34. Cells may be two- or three-dimensional structures of filaments 36, each having the same structural shape. Cell matrix 35 may include regular (i.e., non-random) patterns of differently structured cells arranged in rows/and or columns. Cell matrix 35 may also or alternatively include irregular arrangements of filaments 36, if desired. Spaces 38 between and/or within cells may serve as fluid channels through which coolant in manifold 20 may travel. In this way, cells of filaments 36 may provide a greater surface area over which coolant may contact turbulator 34 and draw heat energy from electronic device 10. Because turbulator 34 may be deposited directly onto second surface 19, complex and detailed cell shapes that may not be feasible through other fabrication methods may be chosen for optimal heat transfer and hydraulic performance.

Turbulator 34 may have one or more parameters that vary along one or more dimensions of cooling device 12. That is, one or more parameters of turbulator 34, such as density, porosity, width, height, length lattice pattern, cell shape, filament cross section shape, etc., may be varied during deposition of turbulator 34 on second surface 19, resulting in a change in one or more of the other parameters. Parameters may be varied along one or more dimensions of cooling device 12, such as a length and a width of cooling device 12, during the deposition of turbulator 34. In this way, optimized heat transfer and/or flow mixing may be achieved by depositing turbulator 34 with optimum parameters at optimum locations based on a determined need for particular heat transfer and flow mixing capacities.

For example, when electronic device 10 includes one or more electronic components 16 that generate heat, turbulator 34 may be deposited on second surface 19 at one or more locations associated with the one or more electronic components 16. That is, when electronic device 10 includes one or more electronic components 16 that produce significant amounts of heat, turbulator 34 may be deposited at particular locations on second surface 19 that are, for example, directly below, above, adjacent, and/or or within a certain distance of those electronic components 16 to more effectively lower the operating temperature of electronic components 16. Parameters of turbulator 34 may also be optimized at those particular locations on second surface 19 in order to promote tailored heat transfer and/or flow mixing at each respective location. Because turbulator 34 may be deposited directly onto second surface 19, complex and detailed variations of parameters at multiple locations that may not be feasible through other fabrication methods may be chosen for optimal heat transfer and flow mixing.

INDUSTRIAL APPLICABILITY

The disclosed sealless cooling device may be used in conjunction with any device, where it is beneficial to reduce the operating temperature of the device while avoiding leakage of a cooling medium onto the device. The disclosed sealless cooling device finds particular applicability with electronic devices that generate significant amounts of heat and would benefit from temperature reduction by fluid (e.g., liquid or gas) cooling. Operation of the exemplary disclosed sealless cooling device will now be discussed.

During operation of electronic device 10, IGBT 14 may receive electrical current at one or more input voltages and generate an output of electrical current at an amplified and/or switched output voltage. The operating temperature of IGBT 14 and/or electronic components 16 may increase as current passes through electronic components 16. Heat generated by electronic components 16 may be conducted through base plate 18, such as from first surface 17 to second surface 19. In some embodiments, heat may also spread from electronic components 16 to other areas of electronic device 10 via conduction through base plate 18.

While IGBT 14 is processing electrical currents, a coolant may be admitted into manifold 20 via inlet channel 22. For example, a liquid coolant, such as water, air, a refrigerant, etc., from an open or closed fluid circuit may be pumped or otherwise admitted into inlet channel 22. Cooler fluid received by inlet channel 22 may flow into cavity 30 within manifold 20 and eventually be expelled as warmer fluid from via outlet channel 24. While flowing through cavity 30, the coolant may engage internal structures and/or turbulator 34. The coolant may be divided, guided, aerated, mixed, or otherwise influenced by internal structures. The coolant may also or alternatively be mixed and/or form interactions with (e.g., flowing through, flowing around, etc.) turbulator 34.

For example, turbulator 34 may be deposited directly onto second surface 19 so as to induce mixing in the coolant flow and increase the surface area contact between the coolant and turbulator 34. By changing the parameters of turbulator 34, particular flow mixing characteristics may be achieved. For instance, changing the height, length, and/or width of turbulator 34 may allow for a greater or lesser amounts of the coolant to be turbulated during operation. Also, changing the thickness, length, and/or cross sectional shapes of filaments 36 may allow for increased or decreased flow resistance through spaces 38 within turbulator 34. Changing other parameters, such as the density and/or porosity of turbulator 34 may also increase or decrease the flow resistance, and hence the flow mixing, experienced by the coolant flowing through turbulator 34. Desired flow characteristics may also be achieved by forming turbulator 34 with a desired structure, such as a lattice structure or cell matrix 35. Lattice structures and cell matrix 35 may be designed and implemented based on how the lattice or cell shape affects aspects of coolant flow. Model analysis and/or empirical testing may be performed to determine how various lattice and/or cell shapes affect flow mixing and/or flow characteristics.

As the coolant engages turbulator 34, heat generated by electronic components 16 may be simultaneously transferred from IGBT 14 to the coolant. That is, heat may be transferred from electronic components 16 (e.g., via base plate 18) and collected by the coolant as the coolant flows around and/or through turbulator 34. By changing parameters of turbulator 34, heat transfer from IGBT 14 to the coolant may be modified as desired (e.g., increased or decreased).

For example, heat transfer may be increased by increasing the thermal conductivity of turbulator 34 (e.g., by forming turbulator 34 with a material having a higher thermal conductivity). Heat transfer may also be increased by increasing the surface area contact between turbulator 34 and either or both of electronic device 10 and the coolant. This may be accomplished by the inclusion of more filaments 36 per unit area or volume of turbulator 34 and/or by increasing the cross sectional area of each filament 36. Particular heat transfer characteristics may be achieved by forming turbulator 34 with a desired structure, such as a lattice structure or cell matrix 35. Lattice structures and cell matrices may be designed and implemented based on how the lattice or cell shape affects aspects of heat transfer. Model analysis and/or empirical testing may be performed to determine how various lattice and/or cell shapes affect heat transfer.

Parameters of turbulator 34 may be changed at various locations along one or more dimensions of cooling device 12 to improve coolant flow and/or heat transfer characteristics at the various locations. For example, parameters of turbulator 34 may be modified at particular locations along cooling device 12, such as where greater heat transfer and/or flow mixing is needed in order to achieve a desired operating temperature of IGBT 14 and/or electronic components 16. In this way, turbulator 34 may be customized to accommodate different types of heat-generating devices and provide optimized heat transfer based on the unique heat generation characteristics of the device. Heat generation characteristics of a device may be determined using model analysis and/or empirical testing, such as by probing the device with temperature sensors (e.g., thermocouples), viewing the device with an infrared temperature scanner, or by another method.

The disclosed sealless cooling device 12 may be manufactured using conventional techniques such as, for example, techniques generally referred to as additive manufacturing or additive fabrication. Other conventional techniques, such as casting or molding may be utilized, if desired. Known additive manufacturing/fabrication processes include techniques such as, for example, 3D printing. 3D printing is a process wherein material may be deposited in successive layers under the control of a computer. The computer controls additive fabrication equipment to deposit the successive layers according to a three-dimensional model (e.g. a digital file such as an AMF or STL file) that is configured to be converted into a plurality of slices, for example substantially two-dimensional slices, that each define a cross-sectional layer of the sealless cooling device 12 in order to manufacture, or fabricate, the sealless cooling device 12. In one case, the disclosed sealless cooling device 12 would be an original component and the 3D printing process would be utilized to manufacture the sealless cooling device 12. In other cases, the 3D process could be used to replicate an existing sealless cooling device 12 and the replicated sealless cooling device 12 could be sold as aftermarket parts. These replicated aftermarket sealless cooling device 12 could be either exact copies of the original sealless cooling device 12 or pseudo copies differing in only non-critical aspects.

Figure 6:
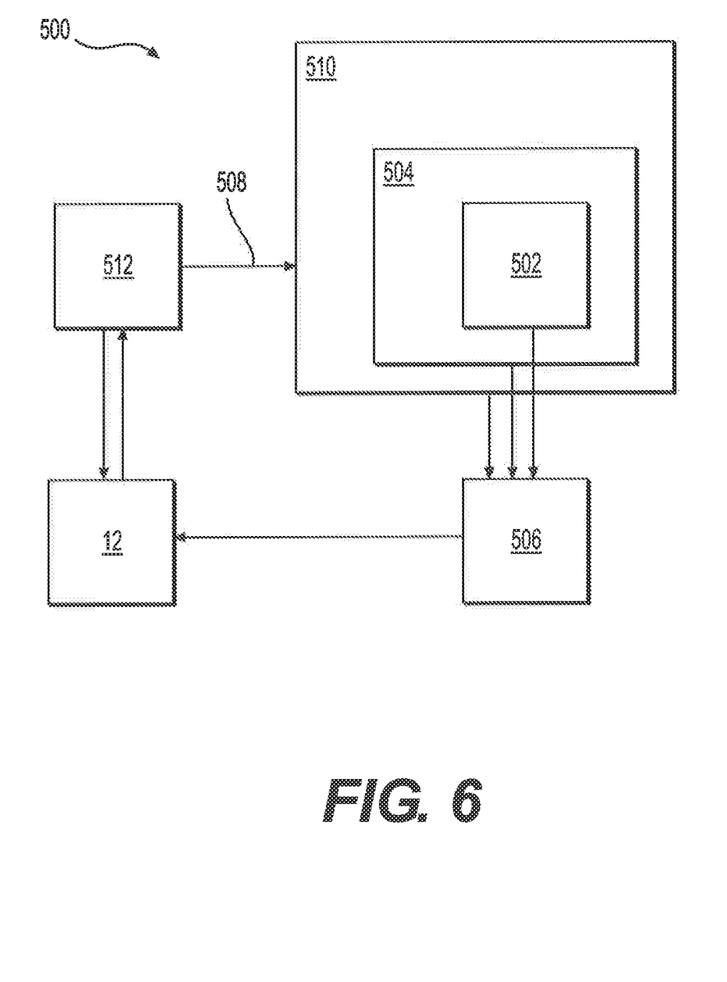
FIG. 6 is a schematic drawing representing an exemplary system for generating a three-dimensional model of the sealless cooling device of FIGS. 1-3.

With reference to FIG. 6, a system 500 that may be used to fabricate sealless cooling device 12 may include a three-dimensional model 502 used to represent an original sealless cooling device 12. Model 502 may be on a computer-readable storage medium 504 such as, for example, magnetic storage including floppy disk, hard disk, or magnetic tape; semiconductor storage such as solid state disk (SSD) or flash memory; optical disc storage; magneto-optical disc storage; or any other type of physical memory on which information or data readable by at least one processor may be stored. Storage medium 504 may be used in connection with a commercially available 3D printer 506 to manufacture, or fabricate, sealless cooling device 12. Alternatively, the three-dimensional model may be transmitted electronically to 3D printer 506 in a streaming fashion without being permanently stored at the location of 3D printer 506 or storage medium 504. In either case, three-dimensional model 502 my constitute a digital representation of sealless cooling device 12 suitable for use in manufacturing sealless cooling device 12.

Three-dimensional model 502 may be formed in a number of known ways. In general, three-dimensional model 502 may be created by inputting data 508 representing sealless cooling device 12 to a computer or a processor 510 such as a cloud-based software operating system. Data 508 may then be used as a three-dimensional model representing physical sealless cooling device 12. The three-dimensional model may be intended to be suitable for the purposes of manufacturing the sealless cooling device 12. In an exemplary embodiment, the three-dimensional model may be suitable for the purpose of manufacturing the sealless cooling device 12 by an additive manufacturing technique.

In the embodiment depicted in FIG. 6, inputting of data 508 may be achieved with a 3D scanner 512. The method may include contacting sealless cooling device 12 via a contacting and data receiving device and receiving data from the device in order to generate the three-dimensional model. For example, 3D scanner 512 may be a contact-type scanner. The scanned data may be imported into a 3D modeling software program to prepare a digital data set. In one embodiment, contacting sealless cooling device 12 may occur via direct physical contact using a coordinate measuring machine that measures the physical structure of sealless cooling device 12 by contacting the surfaces of sealless cooling device 12 with a probe in order to generate a three-dimensional model. In other embodiments, 3D scanner 512 may be a non-contact type scanner, and the method may include directing projected energy (e.g. light or ultrasonic waves) onto the sealless cooling device 12 to be replicated and receiving the reflected energy. From this reflected energy, a computer may generate a computer-readable three-dimensional model for use in manufacturing sealless cooling device 12. In some embodiments, multiple 2D images may be used to create a three-dimensional model. For example, 2D slices of a 3D object can be combined to create the three-dimensional model. In lieu of a 3D scanner, the inputting of data may be done using computer-aided design (CAD) software. In this case, the three-dimensional model may be formed by generating a virtual 3D model of the disclosed sealless cooling device 12 using the CAD software. A three-dimensional model may be generated from the CAD virtual 3D model in order to manufacture sealless cooling device 12.

The additive manufacturing process utilized to create the disclosed sealless cooling device 12 may involve materials such as plastic, rubber, metal, ceramics, minerals etc. In some embodiments, additional processes may be performed to create a finished product. Such additional processes may include, for example, one or more of cleaning, hardening, heat treatment, material removal (e.g., sanding, grinding, etc.), and polishing. Other finishing processes may be additionally or alternatively performed, if desired.

Several advantages may be realized by the implementation of sealless cooling device 12. In particular, because manifold 20 may be deposited directly onto second surface 19, a sealless connection may be formed in a single manufacturing step, thereby decreasing the likelihood of damage caused by leaked coolant while also simplifying and reducing the cost of the manufacturing process. Further, because turbulator 34 may be deposited directly onto second surface 19, intricate parameters of turbulator 34 not feasibly achievable through other fabrication methods may be designed and implemented in a single and cost effective fabrication process. Additionally, because turbulator 34 may be deposited directly onto second surface 19, parameters of turbulator 34 may be varied broadly across electronic device or at specific locations in order to particularly achieve desired coolant flow and/or heat transfer characteristics for optimized performance.

It will be apparent to those skilled in the art that various modifications and variations can be made to the disclosed sealless cooling device. Other embodiments will be apparent to those skilled in the art from consideration of the specification and practice of the disclosed sealless cooling device. It is intended that the specification and examples be considered as exemplary only, with a true scope being indicated by the following claims and their equivalents.

What is claimed is:

1. A cooling device configured to be connected to an object having a surface, the cooling device comprising:
   a manifold configured to be deposited directly onto the surface of the object, wherein the manifold includes:
      a first side configured to be deposited directly onto the surface of the object;
      a cavity formed in the first side;
      an inlet channel fluidly connected to the cavity; and
      an outlet channel fluidly connected to the cavity; and
   a turbulator configured to be deposited directly onto the surface of the object, wherein the turbulator extends into the cavity of the manifold.

2. The cooling device of claim 1, wherein:
   the manifold is formed of a first material; and
   the turbulator is formed of the first material or a second material, wherein the second material has a different thermal conductivity than the first material.

3. The cooling device of claim 1, wherein the turbulator includes a lattice structure.

4. The cooling device of claim 1, wherein the turbulator includes a cell matrix.

5. The cooling device of claim 1, wherein the manifold and the turbulator are each respectively formed of one or more of a metal, a plastic, a ceramic, and a mineral.

6. The cooling device of claim 1, wherein the turbulator has a parameter that varies along a dimension of the cooling device.

7. The cooling device of claim 6, wherein the parameter is one or more of a density, a porosity, a width, a height, a length, a lattice pattern, and a cell shape.

8. The cooling device of claim 1, wherein the turbulator includes a regular arrangement of interlaced filaments.

9. The cooling device of claim 8, wherein the regular arrangement of filaments includes spaces between the filaments configured to channel fluid through the manifold.

10. A method of creating a computer-readable three-dimensional model suitable for use in manufacturing the cooling device of claim 1, the method comprising:
inputting data representing the cooling device to a computer; and
using the data to represent the cooling device as a three-dimensional model, the three dimensional model being suitable for use in manufacturing the cooling device.

11. The method of claim 10, wherein the inputting of data includes one or more of using a contact-type 3D scanner to contact the cooling device, using a non-contact 3D scanner to project energy onto the cooling device and receive reflected energy, and generating a virtual three-dimensional model of the cooling device using computer-aided design (CAD) software.

12. A computer-readable three-dimensional model suitable for use in manufacturing the cooling device of claim 1.

13. A computer-readable storage medium having data stored thereon representing a three-dimensional model suitable for use in manufacturing the cooling device of claim 1.

14. A method for manufacturing the cooling device of claim 1, the method comprising the steps of:
providing a computer-readable three-dimensional model of the cooling device, the three-dimensional model being configured to be converted into a plurality of slices that each define a cross-sectional layer of the cooling device; and
successively forming each layer of the cooling device by additive manufacturing.

15. A cooling device configured to be connected to an object, comprising:
a manifold having a unitary body, wherein the unitary body includes:
a first side having an external surface and an internal surface opposite the external surface, wherein the external surface is configured to connect to the object;
an internal cavity within the body, wherein the internal cavity is disposed between the internal surface of the first side and at least one other surface of the body;
an inlet channel configured to direct fluid into the internal cavity of the body;
an outlet channel configured to direct fluid out of the internal cavity of the body; and
a turbulator deposited directly onto the internal surface of the first side, wherein the turbulator extends into the internal cavity of the manifold.

16. The cooling device of claim 15, wherein:
the manifold is formed of a first material; and
the turbulator is formed of the first material or a second material, wherein the second material has a different thermal conductivity than the first material.

17. The cooling device of claim 15, wherein the turbulator includes a lattice structure.

18. The cooling device of claim 15, wherein the turbulator includes a cell matrix.

19. The cooling device of claim 15, wherein the manifold and the turbulator are each respectively formed of one or more of a metal, a plastic, a ceramic, and a mineral.

20. The cooling device of claim 15, wherein the turbulator has a parameter that varies along a dimension of the cooling device, wherein the parameter is one or more of a density, a porosity, a width, a height, a length, a lattice pattern, and a cell shape.

21. The cooling device of claim 15, wherein the turbulator includes one or more of a regular arrangement of interlaced filaments and an irregular arrangement of interlaced films.

22. The cooling device of claim 21, wherein the one or more of the regular arrangement of interlaced filaments and the irregular arrangement of interlaced films includes spaces between the filaments configured to channel fluid through the manifold.

23. An electronic device, comprising:
a surface;
a cooling device connected to the surface, wherein the cooling device includes:
a manifold deposited directly onto the surface of the electronic device, wherein the manifold includes:
a first side deposited directly onto the surface of the electronic device;
a cavity formed in the first side;
an inlet channel fluidly connected to the cavity; and
an outlet channel fluidly connected to the cavity; and
a turbulator deposited directly onto the surface of the electronic device, wherein:
the turbulator extends into the cavity of the manifold;
the turbulator includes one or more of a lattice structure and a cell matrix; and
the manifold and the turbulator are each respectively formed of one or more of a metal, a plastic, a ceramic, and a mineral.

* * * * *